United States Patent [19]
Blanchard et al.

[11] Patent Number: 4,780,394
[45] Date of Patent: Oct. 25, 1988

[54] PHOTOSENSITIVE SEMICONDUCTOR DEVICE AND A METHOD OF MANUFACTURING SUCH A DEVICE

[75] Inventors: Pierre Blanchard, Echirolles; Jean P. Cortot, Grenoble, both of France

[73] Assignee: Thomson-Csf, Paris, France

[21] Appl. No.: 865,338

[22] Filed: May 21, 1986

[30] Foreign Application Priority Data

May 24, 1985 [FR] France ................................. 85 07901

[51] Int. Cl.⁴ .................................................. G03C 5/00
[52] U.S. Cl. ..................................... 430/314; 430/316;
 430/317; 430/318; 430/330; 437/200
[58] Field of Search ............... 430/313, 314, 316, 317,
 430/330, 331, 318; 357/23.7, 23.9, 23.14;
 437/200, 915

[56] References Cited

U.S. PATENT DOCUMENTS 4,189,826  2/1980  Smith ....................................... 29/590
4,319,395  3/1982  Lund et al. ............................. 29/571
4,428,110  1/1984  Kim ......................................... 29/572
4,597,824  7/1986  Shinada et al. ...................... 156/643

FOREIGN PATENT DOCUMENTS 0130847  4/1984  .
2108755  9/1982  United Kingdom .

OTHER PUBLICATIONS

Journal Of Electronic Engineering, vol. 16, No. 149, May 1979, p. 24, Tokyo, Japan; "Sanyo's New Solar Cells Reduce Costs Per Watt".

Primary Examiner—José G. Dees
Attorney, Agent, or Firm—Oblon, Fisher, Spivak, McClelland, & Maier

[57] ABSTRACT

A photosensitive semiconductor device is provided comprising transparent gates, whose side walls are made from silicide and which, apart from these side walls, are formed from polycrystalline silicon.

3 Claims, 1 Drawing Sheet

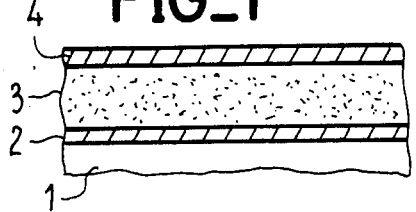
FIG_1
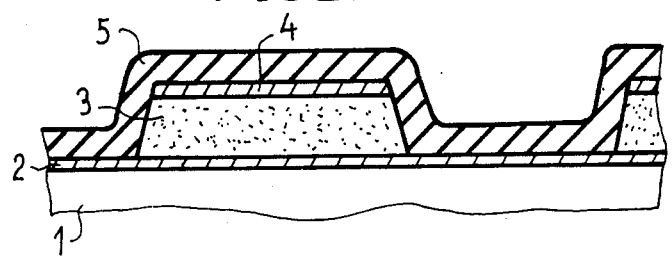
FIG_2
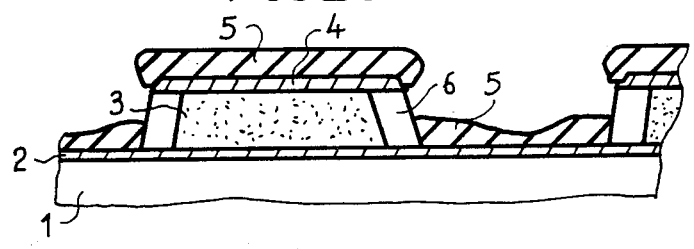
FIG_3
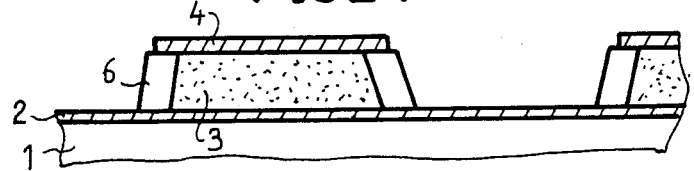
FIG_4
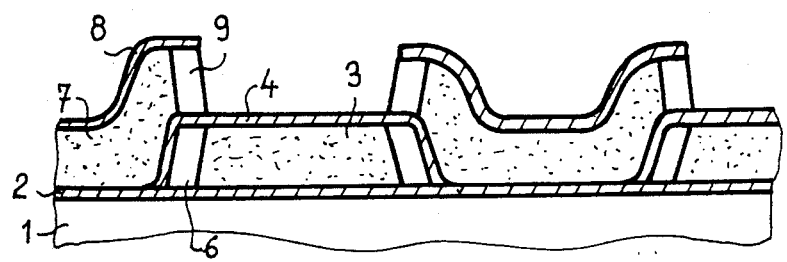
FIG_5

4,780,394

PHOTOSENSITIVE SEMICONDUCTOR DEVICE AND A METHOD OF MANUFACTURING SUCH A DEVICE

BACKGROUND OF THE INVENTION

1. Field of the Invention

The present invention relates to a photosensitive semiconductor device. It also relates to a method of manufacturing such a device.

2. Description of the Prior Art

It is known to construct photosensitive semiconductor devices using silicon, particularly polycrystalline silicon, gates. These gates give entire satisfaction if we consider their MOS characteristics or their transparency to visible radiation in particular. On the other hand these gates have the drawback of having a relatively high resistivity, of the order of 800 $\mu.\Omega.cm$. Because of this resistivity, devices with high integration cannot be formed, that it to say with gates of very small size operating at high frequencies.

To obtain gates of low resistivity, silicide or metals such as aluminium must be used. Such gates are therefore not transparent.

SUMMARY OF THE INVENTION

The present invention proposes overcoming the problem of construction of photosensitive semiconductor devices, having consequently gates transparent to the radiation to be analyzed and having very low resistivity which allows very high integration.

The present invention provides a photosensitive semiconductor device comprising gates transparent to the radiation to be analyzed, wherein the side walls of these gates are made from silicide and, apart from their side walls, these gates are made from silicon.

The invention also relates to a method of manufacturing such a device, comprising the following steps:

(1) on the semiconductor substrate is deposited a dielectric layer, a layer of silicon then a dielectric layer;

(2) the silicon layer coated with the dielectric layer is etched by photolithographic etching;

(3) a metal layer is deposited capable of giving a silicide by thermal combination with silicon;

(4) by heat treatment the metal layer and a small thickness of the silicon layer with which it is in contact are transformed into silicide;

(5) the metal layer which has not been transformed into silicide is removed.

BRIEF DESCRIPTION OF THE DRAWINGS

Other objects, features and results of the invention will be clear from the following description, given by way of non limitative example and illustrated by the accompanying Figures which show:

FIGS. 1 to 4, the steps of a method of manufacturing one embodiment of a device according to the invention with a single gate level; and FIG. 5, an embodiment of a device of the invention with two gate levels.

In the different Figures, the same references designate the same elements but, for the sake of clarity, the sizes and proportions of the different elements have not been respected.

DESCRIPTION OF THE PREFERRED EMBODIMENTS

In FIGS. 1 to 4 there have been shown schematically different steps of a method for manufacturing one embodiment of a device according to the invention with a single gate level.

FIG. 1 shows that a semiconductor substrate 1 is used. This substrate may be monocrystalline silicon. It may also be the silicon layer of an SOS structure, or of any other semiconductor.

On this semiconductor substrate is deposited a dielectric layer 2. This dielectric may for example be formed by an oxide layer, a nitride layer, or by the superimposition of an oxide layer and a nitride layer.

On the dielectric layer is deposited a silicon layer 3 intended for the formation of the gates.

Monocrystalline silicon or amorphous silicon may for example be used. However, polycrystalline silicon is used preferably for it has been technologically mastered.

This silicon layer 3 is covered with a dielectric layer 4. It may be an oxide layer, obtained by oxide growth or by deposition, pyrolitic deposition for example. It may also be a nitride layer.

FIG. 2 illustrates the following step of the method during which the silicon layer 3 covered with the dielectric layer 4 is etched by photolithography. Then on the surface of the device is deposited a metal layer 5 capable of giving a silicide by thermal combination with the silicon to give an alloy.

This metal layer may for example be tantalum, titanium or tungsten.

FIG. 3 shows the result obtained after formation of the silicide in the zones 6.

The silicide 6 is only formed at the places where the metal layer 5 is in direct contact with the polycrystalline silicon 3, that is to say only on the sides of the gates. The upper part of the gates keeps the two superimposed dielectric 4 and metal 5 layers, without any alloying action.

The heat treatment for transforming the metal layer 5 and a small thickness of the silicon layer 3 with which it is in contact into silicide may for example be performed in an oven, at a temperature from 900° to 1000° C. and in an argon atmosphere.

In FIG. 3 it can be seen that, on the side walls of the gates, the metal layer 3 is transformed into silicide while slightly reducing the thickness of the polycrystalline silicon layer 3.

The next step of the method which is shown in FIG. 4 consists in removing the metal layer 5 which has not been transformed into silicide.

That may be done chemically or by plasma etching.

The device which is finally obtained, and which is shown in FIG. 4, comprises then gates transparent to radiation whose side walls are made from silicide 6 and which, apart from these side walls, are formed of silicon 3.

The silicide side walls result in considerable decrease of the resistivity of the gate with respect to a gate made entirely from silicon. Thus, in one embodiment, the resistivity is reduced by 7 through the use of silicide side walls.

These silicide side walls only mask a small part of the photosensitive zone of the device while greatly reducing its resistivity.

Apart from their side walls, the gates are made from silicon and so keep the usual MOS characteristics of gates made from silicon.

It will of course be readily understood that the device of FIG. 4 may be obtained by a method different from the one which has been described.

One advantage of the described method should be pointed out which is that it may be applied whatever the relief of the semiconductor substrate 1 used, and in particular whether it has been made flat or not.

The method described may of course be applied when several gate levels are used. In FIG. 5, by way of example, the device has been shown which is obtained after use of this method when two gate levels are provided with disymmetry by ion implantation.

The method shown in FIGS. 1 to 4 is applied then a silicon layer 7 is deposited so as to form the gates of the second level. Then the method is applied to the gates of the second level, with deposition of a dielectric layer 8, then a metal layer which is transformed into silicide 9 on the side walls of the gates of the second layer and which is elsewhere removed. It can be seen in FIG. 5 that the silicide zones opaque to light are disposed substantially vertically above each other.

A variant of the device of the invention consists in using a dielectric layer 4 whose optical index is chosen so that it serves as antireflection layer.

What is claimed is:

1. A method for manufacturing a photosensitive semiconductor device comprising:
   (a) depositing a first dielectric layer on a semiconductor substrate formed of a material selected from the group consisting of silicon, polycrystalline silicon, microcrystalline silicon, amorphous silicon, monocrystalline silicon, and silicon layer of an SOS structure, said first dielectric layer comprising a material selected from the group consisting of an oxide layer, a nitride layer, and a superimposition of an oxide layer and a nitride layer;
   (b) depositing a first silicon layer on a portion of said first dielectric layer;
   (c) depositing a second dielectric layer on said silicon layer;
   (d) etching the first silicon layer covered by the second dielectric layer by photolithography to expose sides of said first silicon layer with a top surface of said first silicon layer remaining covered by said second dielectric layer;
   (e) depositing a metal layer which may give a silicide by thermal combination with silicon on the sides of the etched first silicon layer and on the second dielectric layer;
   (f) transforming by heat treatment the metal layer and a small thickness of the first silicon layer with which the metal layer is in contact into silicide;
   (g) removing the metal layer which has not been transformed into silicide;
   after step (g), depositing a second silicon layer on the first and second dielectric layers;
   depositing a third dielectric layer on said second silicon layer;
   etching the second silicon layer covered by the third dielectric layer by photolithography to expose sides of said second silicon layer with a top surface of said second silicon layer remaining covered by said third dielectric layer;
   depositing a metal layer which may given a silicide by thermal combination with silicon on the sides of the etched second silicon layer and on the third dielectric layer;
   transforming by heat treatment the second metal layer and a small thickness of the second silicon layer with which it is in contact into silicide; and
   removing the metal layer which has not been transformed into silicide.

2. The method as claimed in claim 1, wherein the silicide formed by heat treatment of the second metal layer and the second silicon layer overlaps the silicide formed by heat treatment of the first metal layer and the first silicon layer.

3. The method as claimed in claim 1, wherein removal of the metal layer is achieved by chemical etching or by plasma etching.

* * * * *